United States Patent [19]

Akesson et al.

[11] Patent Number: 4,843,039

[45] Date of Patent: Jun. 27, 1989

[54] SINTERED BODY FOR CHIP FORMING MACHINING

[75] Inventors: Leif A. E. Akesson, Älvsjö; Marian Mikus, Skärholmen, both of Sweden

[73] Assignee: Santrade Limited, Lucerne, Switzerland

[21] Appl. No.: 48,775

[22] Filed: May 12, 1987

[30] Foreign Application Priority Data

May 12, 1986 [SE] Sweden ................................. 8602147

[51] Int. Cl.$^4$ ....................... C04B 35/56; C22C 29/00
[52] U.S. Cl. ....................................... 501/87; 501/93; 419/14; 419/15; 419/18; 419/29; 75/241; 75/242; 428/403; 428/404; 428/698
[58] Field of Search ...................... 501/93, 87; 419/14, 419/15, 18, 29; 75/241–242

[56] References Cited

U.S. PATENT DOCUMENTS

| | | |
|---|---|---|
| 2,285,909 | 6/1942 | Dawihi . |
| 2,939,796 | 2/1958 | Wolff et al. ............................ 501/93 |
| 3,329,487 | 7/1967 | Sowko et al. . |
| 3,661,599 | 5/1972 | Hollox et al. .......................... 501/93 |
| 3,999,953 | 12/1976 | Kolaska et al. . |
| 3,999,954 | 12/1976 | Kolaska et al. ....................... 419/15 |
| 4,035,541 | 7/1977 | Smith et al. . |
| 4,049,876 | 9/1977 | Yamamoto et al. . |
| 4,066,451 | 1/1978 | Rudy . |
| 4,097,275 | 6/1978 | Horvath . |
| 4,150,195 | 4/1979 | Tobioka et al. . |
| 4,225,344 | 9/1980 | Fujimori et al. . |
| 4,265,662 | 5/1981 | Miyake et al. . |
| 4,330,332 | 5/1982 | Schachner et al. .................... 501/93 |
| 4,368,788 | 1/1983 | Drake . |

FOREIGN PATENT DOCUMENTS 54-50408  4/1979  Japan ...................................... 501/93

Primary Examiner—William R. Dixon, Jr.
Attorney, Agent, or Firm—Burns, Doane, Swecker & Mathis

[57] ABSTRACT

The present invention relates to a sintered body for chip forming machining containing at least one hard constituent comprising a carbide, nitride and/or carbonitride of a metal of group IVB, VB or VIB in the periodical system and a binder metal based upon Co, No and/or Fe, in which the body comprises a core containing eta-phase or an intermediate phase, substantially free of carbon and/or nitrogen surrounded by a hard constituent- and binder phase-containing surface zone, free of said eta-phase or intermediate phase.

17 Claims, 1 Drawing Sheet

SINTERED BODY FOR CHIP FORMING MACHINING

BACKGROUND OF THE INVENTION

The present invention relates to a sintered body useful for cutting operations such as preferably milling and turning.

In Swedish patent applications 8405667-0 (U.S. patent application Ser. No. 06/791,556) and 8503804-0 it has been shown that an increased strength was obtained in sintered bodies of cemented carbide used in tools for rock drilling and also in wear parts by manufacturing said sintered body so that its core comprises a fine grained eta phase, $M_6C$ (e.g. $Co_3W_3C$) and/or $M_{12}C$ (e.g. $Co_6W_6C$), embedded in normal alpha (WC) + beta (Co binder phase) structure at the same time as the sintered body has a surrounding surface zone which consists merely of alpha + beta-phase. Furthermore, said surface zone has an outer part with low content of beta-phase, (binder phase), and an inner part - between the outer paart and the eta phase containing core - which has a high content of binder phase.

SUMMARY OF THE PREFERRED EMBODIMENTS OF THE INVENTION

Figure 1:
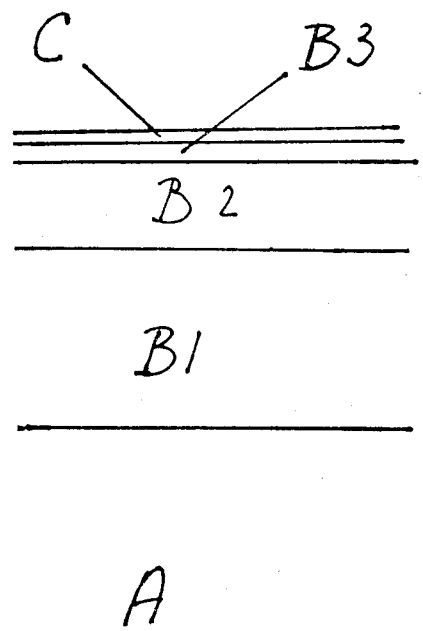
FIG. 1 is a representation of a cross-sectional view of a cutting edge of a cemented carbide cutting insert made according to the present invention.

Surprisingly, it has now been found that cemented carbide cutting inserts, being manufactured so that the above mentioned structure has been obtained, also show highly improved cutting performance in chip forming machining (milling) compared to conventional cemented carbide cutting inserts.

Furthermore, it has also been surprisingly found that just as strong improvements are obtained in cutting such as turning if the cemented carbide body contains cubic carbides (so-called gramma phase) based upon TiC, TaC or NbC in addition to alpha-, beta- and eta-phase. This is particularly surprising because cemented carbide grades for turning (particularly coated grades) are normally very brittle if they contain eta-phase. But because of the above mentioned structure the disadvantages of the eta-phase have been eliminated.

The considerably lower content of binder phase in the outer part of the zone free of eta-phase in relation to the inner part will in this case lead to compressive stresses arising in the zone nearest to the surface which has a positive effect upon the strength and the toughness of the body. At the same time, the wear resistance of said surface zone is also increased by the high content of hard constituents (metal carbides). An increase of the thermoshock resistance has also been obtained which results in a reduction in the initiation and growth of thermal cracks. This can be explained by the different levels of thermal expansion of the two zones in the part free of eta-phase. The outer, binder phase depleted zone has a smaller thermal expansion than the inner zone rich in binder phase.

In FIG. 1, a cross section of a cutting edge according to the present invention is shown. In the figure, A is A cemented carbide comprising alpha-, beta-, eta- and possibly gammaphase, B1 is the cemented carbide having alpha-, high content of beta- and possibly gamma phase, B2 is the cemented carbide or B1 having a lower content of beta phase. The ete-phase in the core A shall be finely distributed, usually with a grain size of 0.5–20 µm, preferably 1–10 µm, and the content of eta-phase shall be at least 2% by volume, preferably at least 10% by volume, but at the most 60% by volume, preferably maximally 35% by volume. The thickness of the zone B1 shall be at the most 1000 µm, and usually 50–500 µm and preferably about 100–300 µm and the zone B2 shall be at the most 300 µm, usually 10–100 µm and preferably about 50 µm thick. The content of binder phase in zone B1 shall be more than 1.2, preferably 1.4–2.5, of the nominal content of binder phase and in zone B2 0.1–0.9, preferably 0.2–0.7, of the nominal content of binder phase.

In cutting operations requiring a great toughness, a further improvement of the cemented carbide-containing gamma phase can be obtained if the sintered body has nearest to the surface a thin zone, at the most 50 µm, usually 10–30 µm, preferably about 15–20 µm, thick which is gamma phase depleted and has higher content of binder phase than B2, see B3 in FIG. 1. Said zone, B3, can also in certain cases contain small amounts of free graphite without impairing the performance. It is also possible that said zone, B3, can have an increased content of gamma phase in a thin part of the zone at the most 10 µm, usually 0.5–5 µm, preferably about 1–2 µm, thick nearest to the surface together with the gamma-phase-free structure described above.

An alternative embodiment for cutting applications where the toughness behaviour is of greatest importance is: The core A shall be of the same type as described above, the thickness of the zone B1 shall be at the most 200 µm, usually 30–100 µm and preferably about 50–80 µm and the zone B2 shall be at the most 15 µm, usually 0–10 µm and preferably less than 2 µm thick and the zone B3 shall be at the most 75 µm usually 10–40 µm and preferably 15–30 µm thick. The content of binder phase in zone B1 shall be more than 1.2, preferably 1.4–2.5 of the nominal content of binder phase and in the zone B3 more than 1.2, preferably 1.4–2, of the nominal content of binder phase.

Particularly in turning applications, it has been found suitable to coat the cemented carbide body with wear resistant layers, zone c in FIG. 1, comprising one or more coatings of carbides, nitrides and/or oxides in order to obtain sufficient wear resistance. Said coating is deposited by known techniques (CVD or PVD). During the coating process, particularly using CVD-technique, small amounts of eta-phase can be formed, especially in the edges cemented carbide being coated. Coatings can be deposited on cutting inserts, which do or do not have the zone B3. Because cutting inserts for turning and milling sometimes have to be ground to accurate dimensions, the zone B2, in certain cases can also be more or less missing.

It has also been found that the cobalt in the eta-phase and the binder-phase can be substituted completely or partly by the metals iron and/or nickel.

In another alternative embodiment, the carburization is carried further so that a thicker zone free of eta-phase is obtained. The eta-phase core should in that case be 10–95%, preferably 40–75%, of the dimensions of the body. Especially, the carburization can be carried so far that all the eta-phase just disappears which results in a body with a high content of binder phase in the center and decreasing content towards the surface. The content of binder phase in the surface shall be 0.1–0.9, preferably 0.4–0.7, of the nominal content. In the centre the content of binder phase shall be at least 1.2, preferably 1.4–2.5, of the nominal binder phase content and be present in the form of a zone with a uniform content of binder phase and with a width of 0.05–0.5, preferably 0.1–0.3, of the width of the body.

In the next above and in the examples, the positive effects of eta-phase in the center of cemented carbide cutting inserts are shown only for those cases where the alpha-phase comprises WC, the gamma-phase comprises TiC, TiN, TaC and NbC and the beta-phase is based upon one or more of the iron group metals (iron, nickel or cobalt). Preliminary tests have shown, however, that very promising results are obtained also when the alpha phase comprises a solid solution of MoC and WC i.e. (Mo,W)C with the same hexagonal structure as pure WC. Furthermore, good results have been reached when the gamma-phase completely or partly comprises other carbide-forming metals of the groups IVB, VB or VI, i.e. Ti, V, Cr, Zr, Nb, Mo, Hf, Ta and W. Positive results have also been obtained when the carbides in the gamma phase are partially substituted by nitrides of the group IVB, VB or VIB metals. The gamma phase may also contain certain amounts of oxygen.

Tests have also been performed with so called cermets, cutting meterials in which the main part of the hard constituents comprises phases based upon TiC-TiN alloyed with other carbide- or nitride-forming elements. The binder phase essentially comprises the iron group metals Co, Ni or Fe and is often alloyed with other elements such as W, Mo, Nb, Ti, Ta, Cr or Al. At low contents of carbon and/or nitrogen, cermet cutting inserts will also contain, besides the usual phases TiN, Ti(C,N), (Ti,W,Mo) (C,N) and metal binder, intermediate phases being more or less free of carbon and/or nitrogen and being formed by the iron group elements (Ni, Co, Fe) and the carbide- or nitride-forming metals, for example $Ni_3Ti$-phase. Said phase can also contain other elements than Ni and Ti. In addition, the $Ni_3Ti$- or $Ni_3$ (Al,Ti)-phase can be precipitated in the form of finely dispersed small particles of the grammа-prime type by a suitable heat treatment. At sufficiently low contents of C and N even eta-phases of the type $M_6C$ or $M_{12}C$ where M=W, Mo, Cr, Co, Ni, etc, can be formed. Cermet cutting inserts with substoichiometric composition in respect to carbon and nitrogen and with finely distributed $Ni_3Ti$ in the entire cutting insert after a carbonitriding heat treatment have a surface zone free of intermediate phases of the type $Ni_3Ti$ (or eta-phase). The thickness of the zone shall be less than 2 mm, preferably less than 0.3 mm. Like conventional cemented carbide cutting inserts of WC-Co or WC-Co-gamma phase type, it has been found that a certain enrichment of the hard carbonitride-phase has taken place in the outer part of the surface zone of the cutting insert. The heat treatment can easily be controlled so that essentially nitride phases or carbide phases are formed in the surface zone. Furthermore, it has been found that the Ti(C,N)-phase in the inner core is somewhat substoichiometric in respect to C and N while in the surface zone it has a more or less stoichiometric composition with respect to carbon and nitrogen.

The invention is additionally illustrated in connection with the following Examples which are to be considered as illustrative of the present invention. It should be understood, however, that the invention is not limited to the specific details of the Examples.

EXAMPLE 1

Cutting inserts for milling (TNJN 1204 AN-geometry) were pressed from a WC-8% Co powder with 0.3% substoichiometric carbon content (5.3instead of 5.6% C). The inserts were presintered in $N_2$ gas for 1 h at 900° C. and standard sintered at 1450° C. After that, half the number of cutting inserts were ground to final shape. Said ground inserts were sparsely packed in fine $Al_2O_3$- powder in graphite boxes and thermally treated in a carburizing atmosphere for 0.5 h at 1350° C. in a pusher type furnace. During the sintering, a structure of alpha+beta-phase with uniformly distributed, fine grained eta-phase therein was formed. During the thermal treatment a very narrow zone of solely alpha+beta structure was formed in the surface of the cutting inserts because carbon diffuses into the cutting inserts and transforms the eta-phase to alpha+beta-phase. The thickness of the zone free of eta-phase was determined to 0.3 mm and the thickness of the part having a low content of cobalt to 0.05 mm. In the very cutting edge, the zones were somewhat thicker. The content of Co in the outer zone having of low content of cobalt was determined to 4% and in the Co-rich inner part of the zone free of eta-phase to 12%. The cutting inserts were then coated by ordinary CVD-technique with 3 μm TiC+1 μm $Al_2O_3$.

EXAMPLE 2

From the sintered but not ground cutting inserts in Example 1, a batch was thermally treated in carburizing atmosphere for 1 h at 1350° C. in a similar way as in Example 1. The inserts were then ground to final dimensions. The thickness of the zone free of eta-phase was determined to 0.4 mm and the part thereof being an outer zone with a low content of cobalt was 0.05 mm thick. The content of Co in the zones free of eta-phase was determined and found to be the same as in Example 1.

EXAMPLE 3

Milling test in cast iron
Work piece material: Gray cast iron SS 0125
Machine: Vertical Köping 20 kW (n=2000)
Milling body: ϕ250 mm AUTO SANDVIK milling cutter
Cutting data:
  speed: v=145 m/min
  Feed: $s_z$=0.2 mm/rev
  Cutting depth: $A_a$ =2.0 mm
  Insert type: TNJN 1204AN
Insert variant 1:
  Standard 8% Co, 92% WC
Insert variant 2:
  According to the invention Example 2.

The test was performed as a single tooth run in a face milling cutter, at which the wear was measured every 10th minute. The result (mean value of three tests) given as cutting time to a mean face wear of the main cutting edge of 0.3 mm was:

|  | Time to VB = 0.3 mm |
| --- | --- |
| 1. Standard variant | 135 min |
| 2. Variant according to the invention | 166 min |

EXAMPLE 4

Milling test in cast iron
Work piece material: Gray cast iron SS0125
Machine: Vertical Köping 20 kW (n=2000)
Milling body: ϕ250 mm AUTO SANDVIK milling cutter
  Cutting data:
    Speed: v=224 m/min
    Feed: $s_z$ =0.2 mm/rev
    Cutting depth: $A_a$ =2.0 mm
    Insert type: TNJN 1204AN
  Insert variant 1:
    Standard 8% Co, 92% Co, 92% WC, CVD-coated with 3 μm TiC +1 μm $Al_2O_3$
  Insert variant 2:
    According to the invention Example 1

The test was performed as a single tooth run in a face milling cutter at which the wear was measured every 10th minute. The result (mean value of 3 tests) given as cutting time to a mean face wear of the main cutting edge of 0.3 mm was:

|  | Time to VB = 0.3 mm |
| --- | --- |
| 1. Standard variant | 210 min |
| 2. Variant according to the invention | 246 min |

EXAMPLE 5

Cutting inserts for turning (TNMM 160408-geometry) were pressed from a WC-2.6% TiC- 1.5% TiN- 3.6% TaC-2.4% NbC- 5.5% Co powder with 0.25% substoichiometric content of carbon. The inserts were presintered according to the Example 1 and then sintered in vacuum at 1450° C. The thermal treatment was then performed as in the Example 1 for 0.5 h at 1350° C. The zone free of eta-phase was in this case 0.3 mm thick and the outer zone with a low content of cobalt 0.1 mm. Outermost, nearest to the surface there was also obtained a zone of 20 μm which was depleted in gamma phase (cubic carbides and nitrides), compare FIG. 1.

These cutting inserts were given a rounded cutting edge and were coated in a conventional way (CVD) with 4.5 μm TiC+3 μm $Al_2O_3$+0.1 μm TiN.

EXAMPLE 6

Cutting inserts for turning (TNMM 160408-geometry) were pressed from the same powder batch as in Example 5. The inserts were presintered and sintered as in Example 5. The thermal treatment was then performed as in Example 1 but only for 10 minutes at 1350° C. The zone free of eta-phase was in this case 100 μm thick and the outer gamma phase depleted zone was 20 μm. The inserts were honed and then heat treated at 1400° C. in a nitrogen containing atmosphere for 15 minutes. The outermost zone nearest to the surface now had an increased content of gamma phase to a depth of about 2 μm. The inserts were finally CVD-coated in the same way as in Example 5.

EXAMPLE 7

Steel turning
Work piece material:
  SS2244 hardened steel annealed to 300 HB, flat iron packet comprising two flat irons separated by a core, leading to an intermittent operation giving great demands upon the cutting edge both at the inlet and the outlet of the work piece.
Cutting data:
  Speed;
    100 m/min Feed:
    0.15-0.35 mm/rev Cutting depth:
    2.0 mm Insert type:
    TNMM 160408
  Machine:
    CNC SMT 12 Swedturn
  Variant 1:
    Standard grade WC- 4.1% TiC- 3.6% TaC- 2.4% NbC- 5.5% Co, CVD-coated with 4.5 μm TiC+3.0 μm $Al_2O_3$ +0.1 μm TiN
  Variant 2:
    According to the invention, Example 5
  Variant 3:
    According to the invention, Example 6

The test was performed by continuously increasing the feed up to rupture. The time to rupture was registered. Accumulated rupture frequency curves for 40 tested cutting edges were drawn. From these diagrams, the time to 50% rupture frequency could be calculated.
Result: Variant 1  1.1 min Variant 2  1.9 min Variant 3  2.4 min

EXAMPLE 8

Cutting inserts for turning (SNGN 120404-geometry) were pressed from a cermet powder consisting of Sandvick Coromant CT515 (TiN-TiC based grade with Ni—-Co-rich binder phase) having substoichiometric contents of carbon and nitrogen. The cutting inserts were sintered according to standard procedure at 1430° C. Half the number of the inserts were thermally treated for about 0.5 h at 1380° C. in a carbonitriding atmosphere. The zone free of $Ni_3Ti$ was 0.3 mm and the outer zone having a low content of binder phase was 0.1 mm. The core contained besides the other phases also finely distributed $Ni_3Ti$ phase type. All the cutting inserts were given a rounded cutting edge.

The cutting inserts were tested by continuous turning of steel.

Work piece material: Hardened steel SS2541 annealed to about 300 HB.
Work piece:
  Solid, cylindrical
Cutting data:
  Speed: v=300 m/min
  Feed: S=0.12 mm/rev
  Cutting depth: a=1.0 mm
  Insert type: SNGN 120404
Variant 1:
  Standard cermet
Variant 2:
  Cermet according to the invention
Result:
Life expressed as time to rupture
Variant 1
  11.0 min
Variant 2
  13.6 min

EXAMPLE 9

The same type of cutting insert and method of manufacture as in the Example 8. Half of the inserts were treated by carbonitriding heat treatment and the rest were not treated. The main amount of the zone B2 was removed by grinding so that there outside the core was essentially the binder phase-rich zone B1. All the cutting inserts were given rounded cutting edges and coated with 3 μm PVD-TiN-layers.

The cutting inserts were tested by intermittent turning of steel.

Work piece material: Low carbon, unalloyed SS1550

Work piece: Tube billet with axial grooves.
Cutting data:
  Speed: v=100 m/min
  Feed: s=0.12 mm/rev
  Cutting depth: a=1.0 mm
  Insert type: SNGN 120404
Variant 1:
  Standard cermet
Variant 2:
  Cermet according to the invention, PVD-coated
Result:
Life expressed as time to rupture
Variant 1: 2.5 min
variant 2: 3.6 min

We claim:

1. Sintered body for chip forming machining comprising at least one hard constituent comprising a carbide, nitride and/or carbonitride of a metal of group IVB, VB or VIB of the periodical system and a binder metal based on Co, Ni and/or Fe, said sintered body comprising (i) a core containing at least one of (a) eta-phase and (b) an intermediate phase being essentially free of carbon and/or nitrogen, said core being surrounded by (ii) a hard constituent-and binder phase - containing surface zone free of said eta-phase or said intermediate phase.

2. Sintered body according to claim 1, wherein the content of binder phase in the outer part of the surface zone is lower than the nominal content of binder phase in the sintered body.

3. Sintered body according to claim 1 wherein the inner part of the surface zone situated nearest to the core has a content of binder-phase greater than the nominal content of binder phase in the sintered body.

4. Sintered body according to claim 1 further comprising a further layer above the surface zone of a cemented carbide free of said eta-phase or said intermediate phase and containing more binder metal than the surface zone.

5. Sintered body according to claim 1 further comprising a coating containing one or more of aluminum oxide, titanium nitride and titanium carbide.

6. Sintered body according to claim 1 in which the eta-phase in the core has a grain size of from 0.5-20 μ and is present in amount of from at least 2 up to a maximum of 60% by volume.

7. Sintered body according to claim 6 in which the eta-phase has a grain size of from 1-10 μ and a content of from at least 10 up to a maximum of 35% by volume.

8. Sintered body according to claim 1 in which the surface zone has a thickness of maximum 1000 μm.

9. Sintered body according to claim 8 wherein the thickness of the surface zone is from 50-500 μm.

10. Sintered body according to claim 9 wherein the thickness of the surface zone is from 100-300 μm.

11. Sintered body according to claim 4 wherein said further layer is at the most 300 μm thick.

12. Sintered body according to claim 11 wherein said further layer thickness is from 10-100 λm.

13. Sintered body according to claim 4 in which the content of the binder phase in the said surface zone is more than 1.2 times the nominal content of the binder phase of the sintered body and the content of the binder phase in the said layer is from 0.1-0.9 times the nominal content of the binder phase of the sintered body.

14. Sintered body according to claim 13 wherein the content of binder phase in the surface zone is from 1.4-2.5 times the nominal content of binder phase of the sintered body and in the said layer is from 0.2-0.7 times the nominal content of the binder phase in the sintered body.

15. Sintered body according to claim 1 in which the sintered body is a turning insert.

16. Sintered body according to claim 1 in which the sintered body is a milling insert.

17. In a turning or milling insert made of a sintered cemented carbide body, the improvement which comprises using as the sintered cemented carbide body, the sintered body of claim 1.

* * * * *